United States Patent [19]

Wicnienski

[11] 4,438,357
[45] Mar. 20, 1984

[54] LEVEL SENSITIVE RESET CIRCUIT FOR DIGITAL LOGIC

[75] Inventor: Michael F. Wicnienski, Antioch, Ill.

[73] Assignee: Baxter Travernol Laboratories, Inc., Deerfield, Ill.

[21] Appl. No.: 389,429

[22] Filed: Jun. 17, 1982

[51] Int. Cl.³ ............................................ H03K 17/28
[52] U.S. Cl. .................................. 307/597; 307/593; 307/603; 307/470; 307/311; 328/73
[58] Field of Search ............... 307/603, 311, 442, 443, 307/200 A, 592, 608, 593; 377/107; 328/73

[56] References Cited

U.S. PATENT DOCUMENTS 3,510,689  5/1970  Baker .
3,576,496  4/1971  Garagnon ........................... 307/603
3,618,052 11/1971  Kwei .
3,619,665 11/1971  Kosonocky .
3,742,257  6/1973  Wittenzellner ..................... 307/603
3,867,580  2/1975  Russell .............................. 307/311
4,085,373  4/1978  McConnell ........................ 377/107

Primary Examiner—John S. Heyman
Attorney, Agent, or Firm—Robert A. Benziger; Paul C. Flattery; George H. Gerstman

[57] ABSTRACT

A circuit is provided for resetting a digital logic circuit, such as a digital counter. A switch 16 provides a first signal when a predetermined condition has occcurred. A flip-flop 24 provides an output reset signal when the flip-flop is in a first state, in response to the first signal. The digital logic circuit to be reset 32 is coupled to the output of the flip-flop 24 for receiving its output reset signal. Feedback means 34, 36, 38 are coupled from the digital logic circuit 32 back to the flip-flop 24 for providing a signal to put the flip-flop into its other state whereby its output reset signal is terminated.

18 Claims, 2 Drawing Figures

LEVEL SENSITIVE RESET CIRCUIT FOR DIGITAL LOGIC

TECHNICAL FIELD

The present invention concerns a novel circuit for providing a rapid reset action for a digital logic circuit, which reset action is not dependent on a storage element to generate the reset signal.

BACKGROUND ART

Often in using digital logic circuitry there is a need to reset a circuit, such as a digital counter, that has been burned off. If the digital counter is turned off but then turned on quickly thereafter, it may happen that the reset circuitry has not functioned and that when the circuit is turned on it has not been completely reset. For example, assume that the digital counter has counted to 100. The counter is then turned off but turned back on promptly thereafter. Although it is desired that the counter now be at zero, because of the rapid turn-on the reset circuitry may not have recovered and the counter may be at an arbitrary number rather than zero. This problem is particularly found when a reset circuit is used requiring a capacitor discharge. In such circuits, if the power supply is turned off, the supply voltage will decrease rapidly to zero. However, such capacitor circuits utilize a capacitor which must be discharged to below a certain point before the circuit can properly be reset again.

In sterilization apparatus, it is particularly important that time or quantity measurements be made accurately and that the digital logic circuitry, such as the digital counters, which may be utilized in making such measurements, be reset properly. For example, if a counter measuring the amount of ultraviolet radiation which has been used to sterilize an item has not been reset properly, the sterilization may be incomplete because the counter may not have started counting at its zero point.

It is, therefore, an object of the present invention to provide a circuit which resets a digital logic circuit, without being dependent on a storage element such as a capacitor to generate the reset signal.

Another object of the present invention is to provide a rapid reset for digital logic circuitry and a self-test to determine whether this rapid reset has actually occurred.

Other objects and advantages of the invention will become apparent as the description proceeds.

DISCLOSURE OF THE INVENTION

In accordance with the present invention, a circuit is provided which does not utilize a capacitor that has to be discharged. Thus when the power supply is turned off and the voltage decreases, as soon as the power supply is turned on again the action of the present invention will occur to reset the digital logic circuit.

To this end, the circuit of the present invention comprises a switch operable to provide a first signal when a predetermined condition has occurred. A bistable device, coupled to the output of the switch, is operable to receive the first signal and to provide an output reset signal when the bistable device is in a first state, in response to the first signal. A digital logic circuit to be reset is coupled to the output of the bistable device for receiving the output reset signal. Feedback means are coupled from the digital logic circuit back to the bistable device for providing a signal to put the bistable device into a second state whereby the output reset signal is terminated.

In the illustrative embodiment, means are provided for determining when the predetermined condition has occurred. The determining means comprise an LED and the switch comprises a phototransistor optically coupled to the LED. The bistable device comprises a flip-flop with the phototransistor being coupled to the clock input of the flip-flop and with the feedback means being coupled to the reset input of the flip-flop. The feedback means includes means for sensing that the digital logic circuit has been reset a predetermined amount.

In the illustrative embodiment, the digital logic circuit comprises a multi-stage counter and the feedback means is coupled to check the upper eight bits of the counter. The feedback means includes a NOR gate with the upper eight bits' outputs connected to inputs of the NOR gate, and the output of the NOR gate is coupled to the flip-flop.

A more detailed explanation of the invention is provided in the following description and claims, and is illustrated in the accompanying drawings.

DETAILED DESCRIPTION OF THE ILLUSTRATIVE EMBODIMENT

Figure 1:
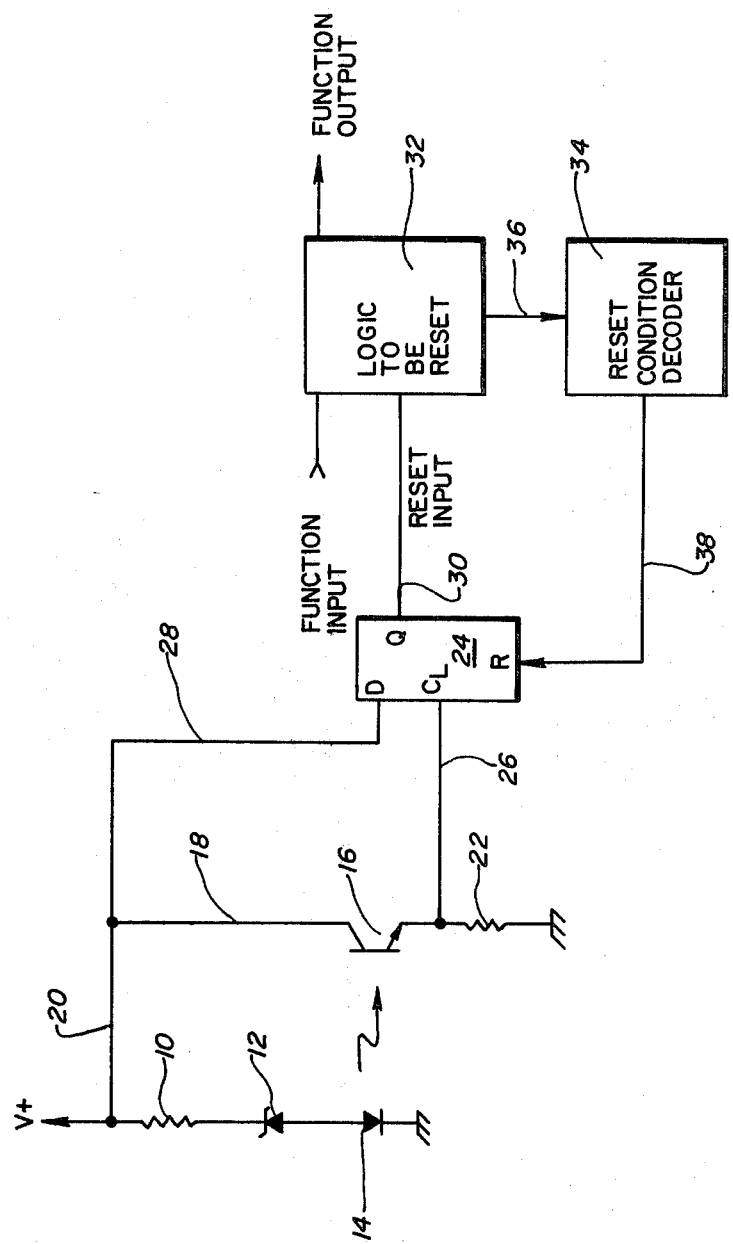
FIG. 1 is a block diagram of a reset circuit constructed in accordance with the principles of the present invention.

Referring to FIG. 1, resistor 10 is utilized to limit the maximum current that will flow through zener diode 12 and light emitting diode (LED) 14, all connected in series. Since zener diode 12 needs a particular voltage to conduct and LED 14 has an intrinsic offset voltage thereby requiring a particular voltage to conduct, once the sum of these two voltages is reached a phototransistor 16, which is optically coupled to LED 14, will become conductive. As illustrated in FIG. 1, the collector of transistor 16 is coupled via line 18 and line 20 to the power supply and the emitter of transistor 16 is coupled via resistor 22 to ground.

In effect, diodes 12 and 14 are utilized to program the level of the voltage at which a reset action will be initiated. Once transistor 16 is conductive, the current flowing through resistor 22 generates a positive going voltage across resistor 22 which is applied to the clock input of a flip-flop 24 via line 26. Lines 18 and 20 are coupled to the data (D) input of flip-flop 24 via line 28.

Although no limitation is intended, flip-flop 24 is preferably a D-type edge triggered flip-flop such as a CMOS 4013 type.

In response to the power supply voltage on the D input of flip-flop 24 and the rising voltage on its clock input, the Q input of flip-flop 24 goes high. The Q output on line 30 of flop-flop 24 is the output reset signal which will not go low unless a high signal is applied to the reset (R) input of the flip-flop 24. Thus line 30 is coupled to the reset input of the logic to be reset 32. Logic 32 may be a clock, with some input function, output function and reset input. It is assumed that the logical function, such as that of a counter, must be reinitialized to some state every time the unit is turned on. When the logical function is operational, the logic will be reset in response to the signal developed by flip-flop 24.

A reset condition decoder 34 is provided and forms part of a feedback circuit including line 36, reset condition decoder 34 and line 38. This feedback circuit is coupled form the logic 32 to the reset input of flip-flop 24. Reset condition decoder 34 determines if in fact the logic to be reset 32 has actually been reset. If it has been reset, a high signal is developed and applied to the reset input of flip-flop 24, causing line 30 to go low and removing the reset signal applied to the logic 32.

Figure 2:
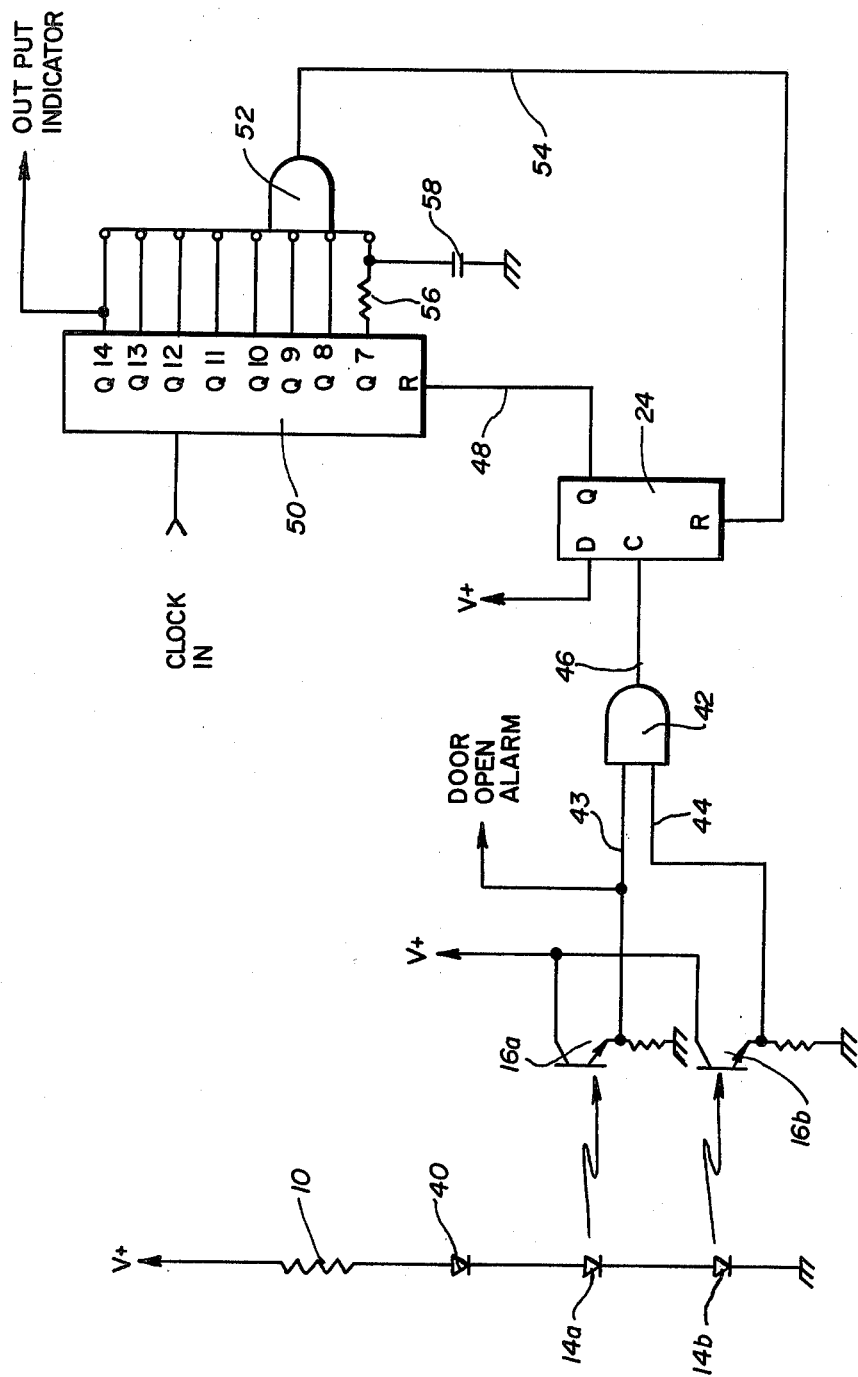
FIG. 2 is a schematic circuit diagram of one form of the invention used to reset a multi-stage digital counter.

Referring now to FIG. 2, a reset circuit is provided for use in a germicidal chamber in which sterilization occurs. In this embodiment, a disposable object is placed in a drawer and ultraviolet sterilization is applied. A counter is utilized as a measuring device but the counter should not begin counting until the drawer is closed and the disposable is in its proper place within the drawer.

In the FIG. 2 embodiment, resistor 10 is in series with a diode 40 which is a standard silicon rectifier having a predetermined intrinsic offset voltage. LED 14a and LED 14b are optically coupled to phototransistors 16a and 16b, respectively. LED 14a and phototransistor 16a are positioned to indicate that the drawer is closed and LED 14b and phototransistor 16b are positioned to indicate that the disposable is in its proper place within the drawer. When the power is turned on, the diode will conduct once the voltage reaches a certain level. However, phototransistor 16a will not be turned on unless the drawer is closed and phototransistor 16b will not be turned on unless the disposable is in its proper location within the drawer. The drawer blocks the actual paths when the drawer is open. The optical paths are cleared when the drawer is closed. Thus phototransistors 16a and 16b are turned on when the drawer is closed, initiating a reset action. In this manner, the optical coupler provides both a "power-on" reset *and* a process (brings counter to zero) reset.

There is a "door open alarm" circuit coupled to the emitter of transistor 16a which is operative under certain conditions. The emitters of transistors 16a and 16b are coupled to the inputs of an AND gate 42 via lines 43 and 44, respectively. AND gate 42 provides a high output signal only if both transistors 16a and 16b are conducting. The high output signal on output 46 of AND gate 42 is fed to the clock input of flip-flop 24 and the data (D) input of flip-flop 24 is coupled to the voltage supply. Likewise, the collectors of transistors 16a and 16b are connected to the power supply voltage.

Once flip-flop 24 is provided with a positive going clock signal, the Q output of flip-flop 24 will be high thus providing an output reset signal via line 48 to the reset input of up-counter 50. In response to the reset input of up-counter 50 going high, the Q outputs of counter 50 should go to zero. If all of the Q outputs of counter 50 go to zero, NOR gate 52 will provide a high output, via line 54, to the reset input of flip-flop 24, Thereupon, the Q output of flip-flop 24 will go low and allow counter 50 to count normally. Should any of the outputs of counter 50 not be zero, NOR gate 52 will have a low output continuously thereby preventing flip-flop 24 from becoming reset and the Q output of flip-flop 24 will always remain high, preventing counter 50 from counting.

Although no limitation is intended, in the illustrative embodiment counter 50 is a 14 stage ripple counter, type 4020. NOR gate 52 acts as a decoder to check that the upper eight bits of counter 50 have in fact been reset. If the upper eight bits of counter 52 have been reset, as stated above NOR gate 52 generates a high output via line 54 to the reset input of flip-flop 24, causing the Q output of flip-flop 24 to go low thereby removing the reset signal from counter 50. By checking the upper eight bits the circuit effectively determines whether the reset has been successful at least to a predetermined degree.

Should the drawer of the germicidal chamber become opened and then quickly closed, or should the power supply voltage be removed and then turned on again quickly, a reset signal will be generated that is not dependent on a time constant for recovery in the reset signal generator. Such disruptive actions, such as the opening of the drawer or the removal of the voltage supply, could happen with relatively great frequency without the problems concomitant with the use of a capacitor in the reset circuit.

In using a ripple counter, such as counter 50, the outputs may be slightly offset and in this manner the transition of the counter outputs are not always simultaneous. Thus a transient might appear at the output of NOR gate 52. To avoid this problem, a resistor 56 and a capacitor 58 are provided as a delay network in order to shift the Q7 output, later in time, to the degree necessary so that spurious outputs are provided by NOR gate 52.

Although an illustrative embodiment of the invention has been shown and described, it is to be understood that various modifications and substitutions may be made without departing from the novel spirit and scope of the present invention.

What is claimed is:

1. A system for resetting a digital logic circuit, which comprises:
   a switch operable to provide a first signal when a predetermined condition has occurred;
   a bistable device operable to receive said first signal and to provide an output reset signal when the device is in a first state, in response to said first signal;
   a digital logic circuit to be reset coupled to the output of the bistable device for receiving the output reset signal;
   feedback means coupled from said digital logic circuit back to said bistable device for sensing the state of the digital logic circuit and for switching the bistable device into a second state only when said logic circuit is in its reset condition whereby said output reset signal is terminated; whereby a functional output from the digital logic circuit is prevented unless the digital logic circuit is in its reset condition when the system is activated.

2. A circuit as described in claim 1, including means for determining when said predetermined condition has occurred, comprising a diode and an LED.

3. A circuit as described in claim 2, said switch comprising a transistor optically coupled to said LED.

4. A circuit as described in claim 1, said bistable device comprising a flip-flop with said switch being coupled to its clock input and said feedback means being coupled to its reset input.

5. A circuit as described in claim 1, said digital logic circuit comprising a counter.

6. A circuit as described in claim 1, said feedback means including means for sensing that the digital logic circuit has been reset.

7. A system for resetting a digital logic circuit, which comprises:
   means for determining when a predetermined condition has occurred;
   a switch which operates to provide a first signal when said predetermined condition has occurred;
   said means for determining comprising an LED and said switch comprising a transistor optically coupled to said LED;
   a bistable device coupled to the output of said switch and operable to provide an output reset signal when the device is in a first state, in response to said first signal, said bistable device comprising flip-flop with said switch being coupled to its clock input;
   a digital counter to be reset coupled to the output of the flip-flop for receiving the output reset signal;
   feedback means coupled from said digital counter back to said flip-flop for sensing the state of said counter and for switching the flip-flop into a second state only when said counter is in its reset condition whereby said output reset signal is terminated, said feedback means being coupled to the reset input of said flip-flop;
   said feedback means including means for sensing that the digital counter has been reset; whereby a functional output from the counter is prevented unless the counter is in its reset condition when the system is activated.

8. A circuit as described in claim 1, said digital logic circuit comprising a multi-stage counter and said feedback means being coupled to check the upper eight bits of said counter.

9. A circuit as described in claim 8, said feedback means including a NOR gate with the upper eight bits' outputs being connected to inputs of the NOR gate and the output of the NOR gate being coupled to the bistable device.

10. A circuit as described in claim 9, said bistable device comprising a flip-flop with said switch being coupled to its clock input and said feedback means being coupled to its reset input.

11. A system for resetting a digital logic circuit, which comprises:
   a first switch operable to provide a first signal when a first predetermined condition has occurred;
   a second switch operable to provide a second signal when a second predetermined condition has occurred;
   means for providing a third signal only when said first and second signals are provided;
   a bistable device operable to receive said third signal and to provide a reset signal when the device is in a first state;
   a digital logic circuit to be reset coupled to the output of the bistable device for receiving the reset signal;
   feedback means coupled from the digital logic circuit back to said bistable device for sensing the state of the digital logic circuit and for switching the bistable device into a second state only when said logic circuit is in its reset condition whereby said reset signal is terminated; whereby a functional output from the digital logic circuit is prevented unless the digital logic circuit is in its reset condition when the system is activated.

12. A circuit as described in claim 11, including first means for determining when said first condition has occurred and second means for determining when said second condition has occurred.

13. A circuit as described in claim 12, said first means and said second means each comprising an LED; said first and second switches being optically coupled to said first and second LEDs, respectively.

14. A circuit as described in claim 11, said bistable device comprising a flip-flop with said switch being coupled to its clock input and said feedback means being coupled to its reset input.

15. A circuit as described in claim 11, said feedback means including means for sensing that the digital logic circuit has been reset.

16. A circuit for resetting a digital logic circuit, which comprises:
   a first switch operable to provide a first signal when a first predetermined condition has occurred;
   a second switch operable to provide a second signal when a second predetermined condition has occurred;
   means for providing a third signal only when said first and second signals are provided;
   a bistable device operable to receive said third signal and to provide a reset signal when the device is in a first state;
   a digital logic circuit to be reset coupled to the output of the bistable device for receiving the reset signal; and
   feedback means coupled from the digital logic circuit back to said bistable device for providing a signal to put the bistable device into a second state whereby said reset signal is terminated;
   said digital logic circuit comprising a multi-stage counter and said feedback means being coupled to check the upper eight bits of said counter.

17. A circuit for resetting a digital logic circuit, which comprises:
   a first switch operable to provide a first signal when a first predetermined condition has occurred;
   a second switch operable to provide a second signal when a second predetermined condition has occurred;
   means for providing a third signal only when said first and second signals are provided;
   a bistable device operable to receive said third signal and to provide a reset signal when the device is in a first state;
   a digital logic circuit to be reset coupled to the output of the bistable device for receiving the reset signal; and
   feedback means coupled from the digital logic circuit back to said bistable device for providing a signal to put the bistable device into a second state whereby said reset signal is terminated, said feedback means including means for sensing that the digital logic circuit has been reset; said feedback means including a NOR gate with the upper eight bits' outputs being connected to inputs of the NOR gate and the output of the NOR gate being coupled to the bistable device.

18. A circuit as described in claim 17, said bistable device comprising a flip-flop with said switch being coupled to its clock input and said feedback means being coupled to its reset input.

* * * * *